United States Patent Office 3,439,402
Patented Apr. 22, 1969

3,439,402
APPARATUS FOR COMBING COMPONENT LEADS

Leslie S. F. Chin, Baltimore, Md., and Carl L. Grayson, Tucson, Ariz., assignors to Westinghouse Electric Corporation, Pittsburgh, Pa., a corporation of Pennsylvania Filed Aug. 22, 1966, Ser. No. 574,073
Int. Cl. D01g *19/00;* B21f *1/02*
U.S. Cl. 29—203 4 Claims

ABSTRACT OF THE DISCLOSURE

Apparatus for combing leads is provided including a combing plate having a plurality of spring-loaded fingers disposed in a plane perpendicular to the direction of the component leads. The combing plate is actuated by an adjacent camming plate that is free to rotate and has a plurality of slots for tracking pins extending from the fingers in the combing plate so rotation of the camming plate determines the extent of motion of the fingers. The packaged component is moved with respect to the combing fingers so that they pass through the leads, down their length, combing and aligning them. When the combing operation has been completed and the leads have begun to enter separate openings in a test socket, the mechanism is released so the fingers are withdrawn from the leads.

This application describes and claims apparatus for the combing of leads of electronic components. In the prior art a number of types of electronic components have had flexible leads requiring separation and straightening particularly for positioning the leads in a socket for electrical testing and the like and also for mounting for its final use. Generally the number of leads, their spacing, the degree of flexibility of the leads and their length has been such that they may be spread by manual operations using tweezers or other instruments.

A T0–5 package, for example, has been used for sometime for enclosing transistors requiring only three leads. In such instances the manual alignment of the leads prior to insertion into a test socket has been tolerable. However, with the advent of semiconductor integrated circuits a multifunctional component is enclosed in the same type of package components and requires up to 12 leads or so. Manual combing or alignment thus becomes very tedious requiring a high degree of operator's skill and patience.

It is therefore an object of this invention to provide apparatus for combing leads of a component even though such leads are numerous, closely spaced and are on a small package.

Another object is to pr ovide apparatus for lead combing requiring minimal operator skill and time.

Another object is to provide apparatus that not only combs leads of electronic components but inserts the component into a test socket without additional handling.

Another object is to provide apparatus that not only combs component leads, inserts the components in a socket but also removes the component from the socket without additional handling.

The apparatus in accordance with this invention achieves the above mentioned and additional objects and advantages in providing means for positioning a component whose leads require straightening in a position vertically spaced from the socket in which it is to be inserted after lead straightening. A unit including a plurality of combing fingers is disposed directly below the package in a plane substantially parallel to the package surface from which the leads extend. A mechanism is provided to move the fingers in a horziontal plane so that one extends between each adjacent pair of leads of a component. An operator simply by the downward motion of a handle pivoted over the position of the package effects motion of the combing fingers so that they pass through the leads, down their length, combing and aligning them. When the combing operation has been completed and the leads have begun to enter separate openings in a test socket, the referred to mechanism is released so the fingers are withdrawn from the leads. As the motion of the handle is reversed the device is lifted out of the socket with the leads remaining straight so that the entire operation of combing and aligning the leads together with insertion into the electrical test socket and removal from the electrical test socket are performed in one downward and upward cycle.

It will be understood that the apparatus of this invention may advantageously be used even without incorporation of the component testing socket. That is, merely where it is desired to comb the leads of a component either prior to shipping or prior to insertion into its final position in assembled equipment.

The apparatus briefly described above may take a variety of forms as is apparent from the generally described principles herein. However, certain aspects of a significant nature will be described in detail because of their value in achieving the intended operation of the device.

The invention together with the above-mentioned and additional objects and advantages thereof will be better understood by referring to the following description taken with the accompanying drawing wherein.

Figure 2:
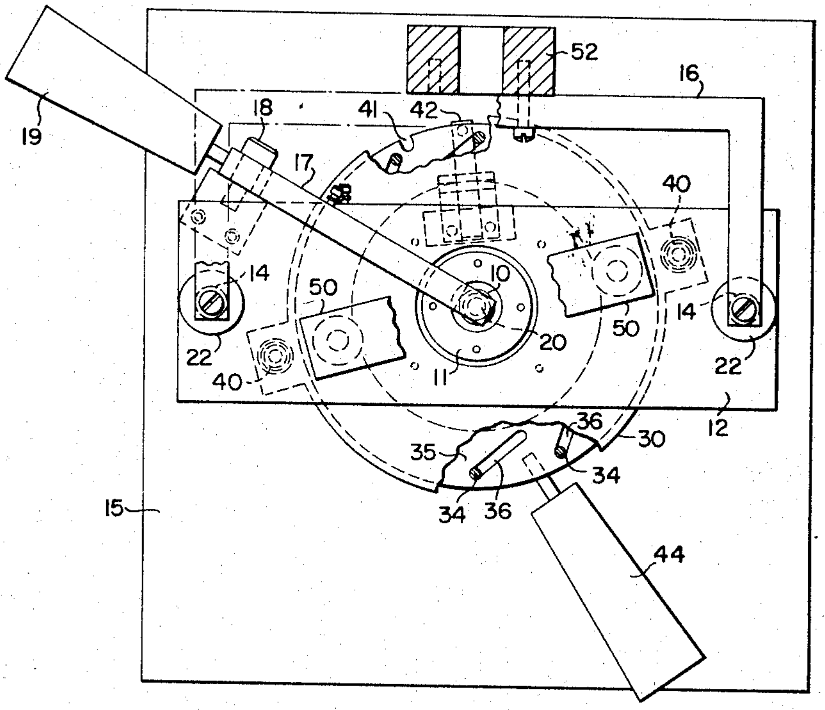
FIG. 2 is a plan view taken along the line II—II of FIG. 1 also partly in section and partly broken away for clarity.
Figure 1:
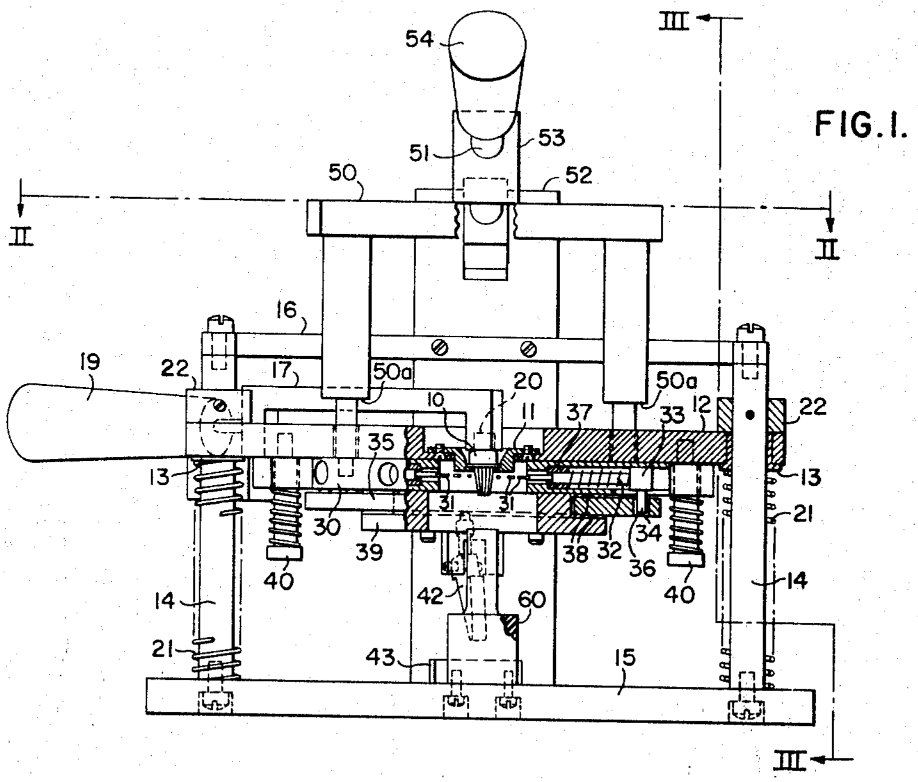
FIGURE 1 is a front elevation view of apparatus in accordance with this invention wherein some elements are shown in section and some broken away for clarity of illustration.
Figure 3:
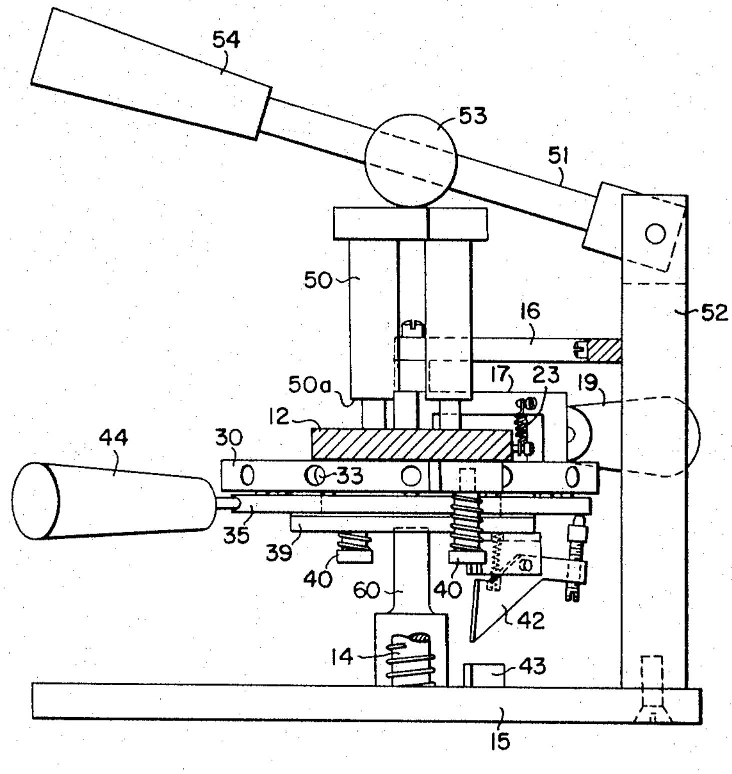
FIG. 3 is a side elevation view taken along the line III—III of FIGURE 1 also partly in section and partly broken away for clarity.
Figure 4:
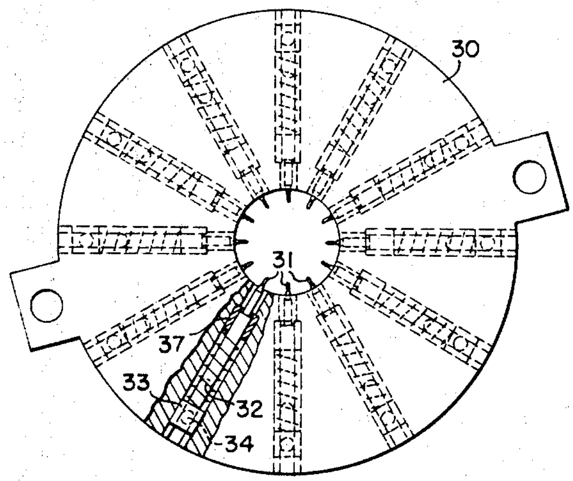
FIGS. 4 and 5 are plan views of some individual elements employed in the apparatus of FIGS. 1, 2 and 3.
Figure 5:
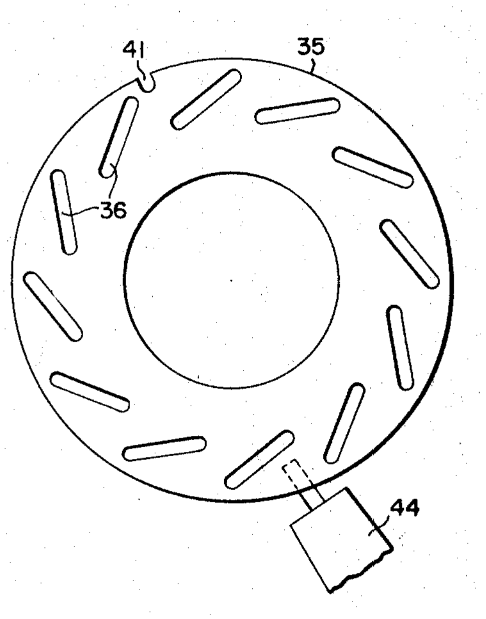

Referring now to the several figures of the drawing, a first set of elements are provided for positioning a component 10 in vertically displaced position over an electrical test socket 60. The component 10 is enclosed in a T0–5 package or the like in this example. Such a package has a circular configuration of leads extending from one surface. That surface is horizontally oriented in the apparatus by positioning the flange of the package cap in a collar 11 so that the leads extend downward toward the socket 60. Collar 11 may suitably be of Teflon material for insulating the package during electrical tests.

It will be apparent that the apparatus may be adapted to other package types and lead configurations. The T0–5 package when used for integrated circuits has up to about 12 leads that are arranged in a circle having a diameter of about 0.200 inch. The individual leads are about 20 mils in diameter. Thus it is apparent that with such small spacings manual lead straightening is difficult. The leads are about ½ inch long, readily permitting their entanglement which is the usual case particularly occurring in the operation in which the leads are embedded in the header prior to assembly of the cap on the header.

The positioning collar 11 is joined to a positioning plate 12. The positioning plate 12 is secured to posts 14 through bushings 13 permitting its vertical motion. Springs 21 bear against the plate 12 or bearing 13 maintaining the plate in a normal raised position against the adjustable stops 22. A support arm 16 joins the fixed posts and is joined to an upright support 52. A positioning arm 17 has one extremity bearing down on the component 10 by means of a spring 23 and includes a magnet 20 at that extremity for permitting easy withdrawal of the component 10 after performance of the straightening and testing operation. At the other extremity of the positioning arm 17 is a pivot 18 by which the working end of the arm is moved up and down, the operator using a handle 19.

In a plane that is hoizontal and somewhat below the plane of the component surface from which the leads extend are a plurality of fingers 31 positioned and united within a combing plate 30. The fingers 31 are each spring loaded between a mount 33 and a pin bearing member 37 by a spring 32. The fingers 31 are disposed in a circular array so that upon extension each finger is inserted between an adjacent pair of leads of the component 10. The component 10 preferably has a key portion on the flange of the cap fitting in a slot in the collar 11 for orientation purposes. The fingers 31 may each suitably have a hardened steel tip secured within a brass rod.

Extending vertically downward from each of the finger mounts 33 is a pin 34 each positioned in one of plurality of slots 36 of a rotatable camming plate 35. The slots 36 in the camming plate 35 are oriented with their extremities radially displaced from the center of the circular camming plate 35 so that upon rotation of the camming plate 35 motion is imparted to the pins 34 and hence to the fingers 31 of the combing plate 30. Gaskets 38 of a suitable material such as Teflon material act as bearing surfaces which provides low friction between the camming plate 35 and both the combing plate 30 and a support plate 39 under the camming plate 35.

The camming plate 35 is provided with a handle 44 so that the operator can effect its rotation. Upon rotation of the camming plate 35 clockwise a notch 41 in the edge of the camming plates comes in a position over a latching mechanism 42 including a spring loaded latching finger that bears upward against the camming plate 35 and slips into the notch 41 fixing it in position with the fingers at their maximum inward projection into the leads of the component 10.

During the operation of the apparatus in which vertical motion is imparted to the camming plate 35 which will be described hereinafter, the latching mechanism 42 is brought into contact with a tripping block or latch release 43 removing the finger or key of the latching mechanism 42 from the notch 41 and causing the fingers to be forced outward by reason of the springs 32 bearing against the mounts 33 thus reverse rotating the camming plate 35.

Additional elements of the assembly include a bridge member 50 extending over the position of the component 10. A pivot 53 is positioned on top of the bridge 50 through which main operating arm 51 extends. The operating arm 51 has at one extremity the main operating handle 54 for effecting vertical motion of the working portion of the assembly. The operating arm 51 is affixed at one extremity to the upright support 52.

The permanently fixed members of the assembly include the base member 15 which has posts 14, socket 60, latch release block 43 and upright 52 joined to it. Stops 22 and support arm 16 are also permanently affixed elements while the remaining elements are designed for vertical motion with the camming plate 35 also being rotatable.

In operation the following sequence of operation occurs. First, by downward motion of the handle 19 the positioning arm 17 is raised. The operator positions a component 10 within the collar 11 and then permits the arm 17 to lower on top of the component 10. The operator then rotates the camming plate 35 by means of handle 44 in a clockwise direction so that the fingers 31 are inserted within the leads and the camming plate 35 is latched in position. Using the handle 54, by moving it downward in a single stroke the leads are combed, the component 10 is placed in position in the socket 60 and the coming fingers are retracted. On the upward stroke the component 10 is extracted from the socket 60. Upon raising the positioning arm 17 the component is extracted from the collar 11 by reason of the magnet 20 from which the operator removes it.

In the downward stroke of the main operating handle 54 a sequence of functions are automatically performed. Initially what is effected is a motion of the bridge 50 that extends through the positioning plate 12 into the combing plate 30. Thus the combing plate 30, and the plates 35 and 39 below it, are moved with respect to the component 10 to effect the combing of the leads. This function is complete when the enlarged portion **50*a* of the bridge 50 strikes the plate 12, thus initiating motion of the plate 12 and the component 10. Immediately after the completion of the combing of the leads the latching mechanism 42 strikes the block 43 releasing the latch so that the camming plate 35 reverse rotates and the pins 31 are withdrawn from the leads so that they are not in the way and the leads may be inserted into the socket 60 through the continued motion of the center portion of the assembly. Upon the upward stroke of the main operating arm 54 the fingers 31** stay withdrawn and the elements return to their original position.

Among the significant features of the described apparatus are the manner in which the fingers 31 are readily inserted and withdrawn from their combing position within the leads of the component 10 by simple manipulation of the camming plate 35. The apparatus permits not only lead straightening but also insertion into the test socket in a single upward and downward stroke.

The apparatus may be modified to reduce further the required operations by a human operator. For example, main operating handle 51 may be mechanically linked, such as through the use of gears, to camming plate 35 to cause its rotation during the initial portion of the downward stroke and avoid the need to set the plate manually. Any of the described manual operations are, of course, susceptible of automatic implementation by known techniques. However, it is an advantageous feature of the invention as described in the specific embodiment that both equipment costs and operator costs can be kept low.

While the present invention has been shown and described in a limited number of forms, it is apparent that further changes may be made in keeping with the invention.

We claim:

1. Apparatus for combing leads of an electronic component comprising: a collar member for positioning a component; positioning means joining said collar member to posts disposed in a first direction, said means being free to move in said first direction along said posts; a combing plate including a plurality of spring loaded fingers disposed in a plane perpendicular to said first direction, said combing plate being adjacent said positioning means and joined thereto; a camming plate disposed in a plane perpendicular to said first direction adjacent said combing plate, said camming plate being free to rotate and having a pluarlity of slots for tracking pins extending from said fingers so rotation of said camming plate determines the extent of motion of said fingers.

2. The subject matter of claim 1 further comprising: means bearing down on said combing plate to effect its motion in said first direction for a first distance without moving said positioning means.

3. The subject matter of claim 2 wherein: after said first distance has been traversed a latching mechanism releases said camming plate so said spring loaded fingers are forced radially outward.

4. The subject matter of claim 3 wherein: after said first distance has been traversed, said means bearing down also bears down on said means for positioning and effects its motion in said first direction so a component whose leads have been combed can then be inserted in a socket.

References Cited

UNITED STATES PATENTS

| | | | |
|---|---|---|---|
| 2,425,127 | 8/1947 | Schafer | 29—25.19 |
| 2,644,998 | 7/1953 | Klinkert et al. | 29—25.14 |
| 3,151,387 | 10/1964 | Clemen et al. | 29—203 |
| 3,226,810 | 1/1966 | Beliveau | 29—407 |

THOMAS H. EAGER, *Primary Examiner.*

U.S. Cl. X.R.

140—147; 19—122